United States Patent
Cheng et al.

[11] Patent Number: 5,891,805
[45] Date of Patent: Apr. 6, 1999

[54] METHOD OF FORMING CONTACTS

[75] Inventors: Peng Cheng, Campbell; Brian S. Doyle, Cupertino, both of Calif.

[73] Assignee: Intel Corporation, Santa Clara, Calif.

[21] Appl. No.: 766,330

[22] Filed: Dec. 13, 1996

[51] Int. Cl.⁶ .................................................. H01L 21/302
[52] U.S. Cl. ...................... 438/696; 438/596; 438/633; 438/639
[58] Field of Search .................... 438/233, 596, 438/626, 629, 633, 639, 627, 666, 668, 688, 696, 692, 693, 742, 945, 946, 947

[56] References Cited

U.S. PATENT DOCUMENTS

| | | | |
|---|---|---|---|
| 4,358,340 | 11/1982 | Fu | 156/643 |
| 4,648,937 | 3/1987 | Ogura et al. | 438/945 |
| 5,231,042 | 7/1993 | Ilderem et al. | 437/44 |
| 5,254,498 | 10/1993 | Sumi | 438/653 |
| 5,292,689 | 3/1994 | Cronin et al. | 438/643 |
| 5,420,067 | 5/1995 | Hsu | 438/947 |
| 5,462,893 | 10/1995 | Matsuoka et al. | 437/195 |
| 5,472,901 | 12/1995 | Kapoor | 437/60 |
| 5,474,651 | 12/1995 | Huebner | 156/644.1 |
| 5,488,013 | 1/1996 | Geffken et al. | 438/643 |
| 5,529,956 | 6/1996 | Morishita | 437/195 |
| 5,595,941 | 1/1997 | Okamoto et al. | 437/228 |
| 5,639,686 | 6/1997 | Hirano et al. | 437/189 |
| 5,658,830 | 8/1997 | Jeng | 438/620 |

OTHER PUBLICATIONS

Horstmann, J.T., et al.; "Characterization of Sub–100 nm–MIS–Transistors Processed by Optical Lithography and a Sidewall–Etchback Technique"; Micro–and Nano–Engineering 95; Aix En Provence, France; Sep. 26–28, 1995; Section P1.

M. Bohr; "Interconnect Scaling—The Real Limiter to High Performance ULSI"; *IEDM Proc.*; 1995; pp. 241–243.

*Primary Examiner*—Robert Kunemund
*Assistant Examiner*—Anita Alanko
*Attorney, Agent, or Firm*—Blakely, Sokoloff, Taylor & Zafman LLP

[57] ABSTRACT

A method of forming a contact is disclosed. A substrate having a desired electrical contact location is provided. The substrate has a conductive layer. A first mask with an edge over the desired electrical contact location is formed on the substrate. A contact material is deposited over the first mask and the substrate. A first portion of the contact material is then removed such that a second portion of the contact material remains to form a contact adjacent to the edge of the mask, over the desired electrical contact location.

39 Claims, 18 Drawing Sheets

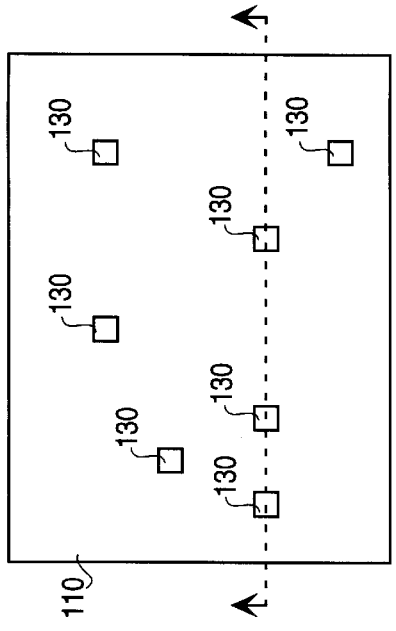
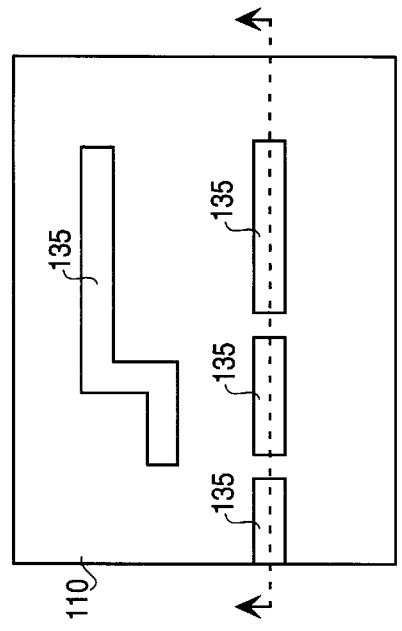
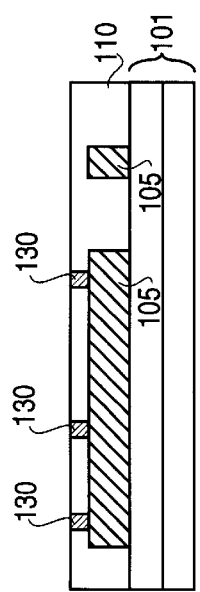
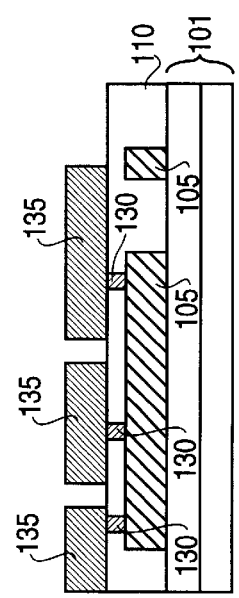
FIG. 6B (PRIOR ART)
FIG. 7B (PRIOR ART)
FIG. 6A (PRIOR ART)
FIG. 7A (PRIOR ART)

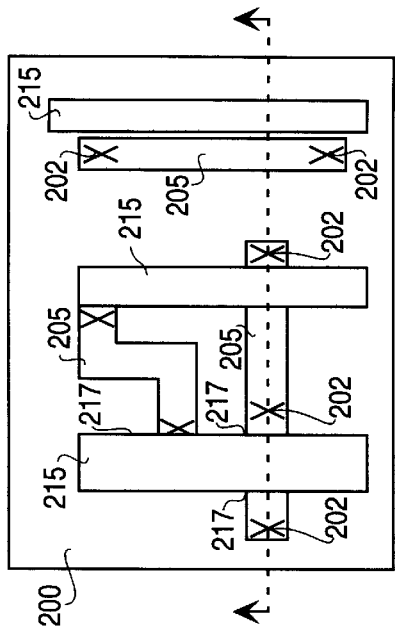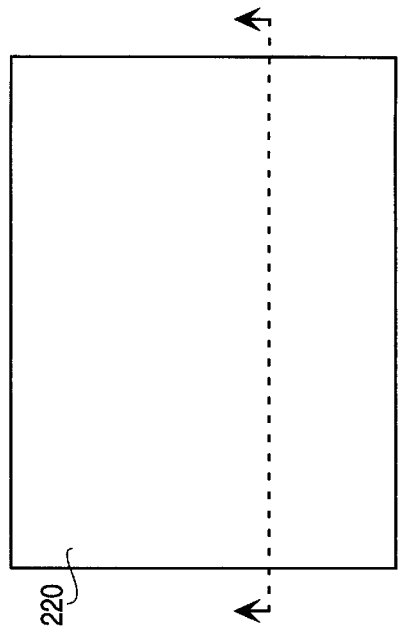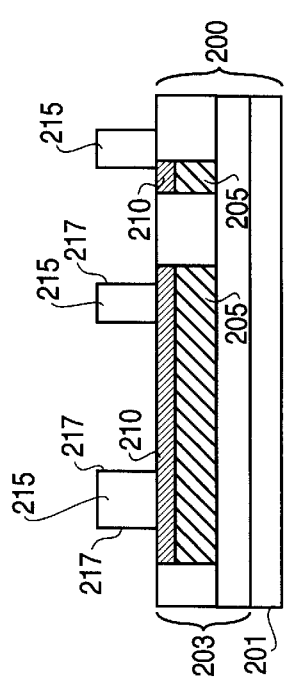
FIG. 10A
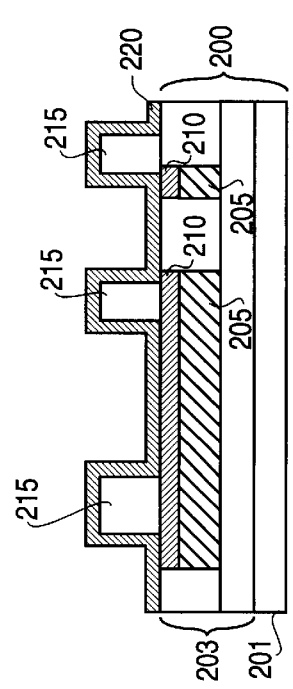
FIG. 11A

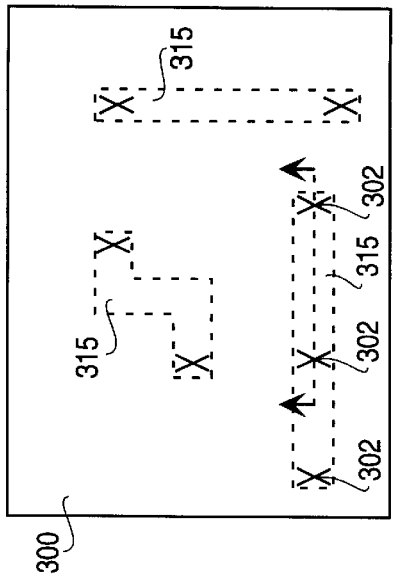
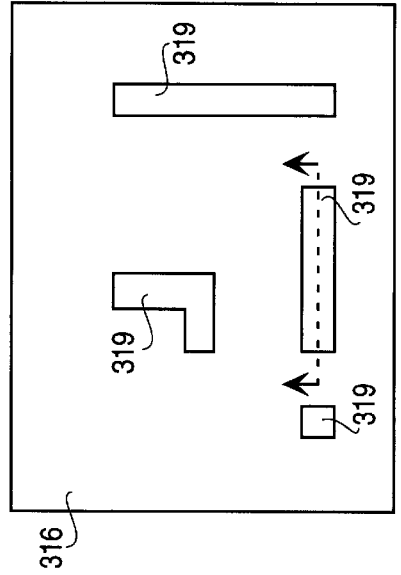
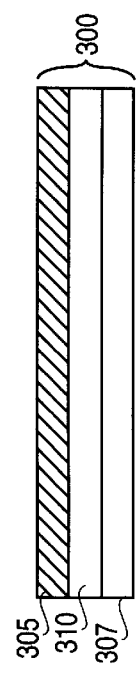
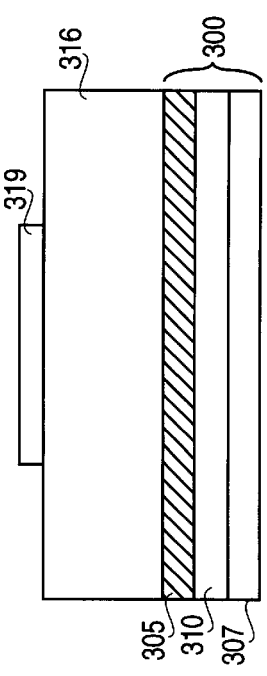

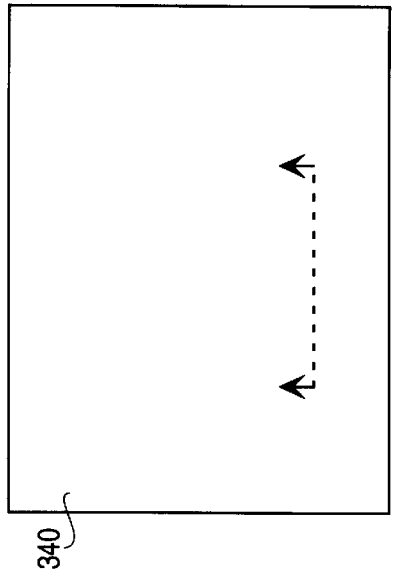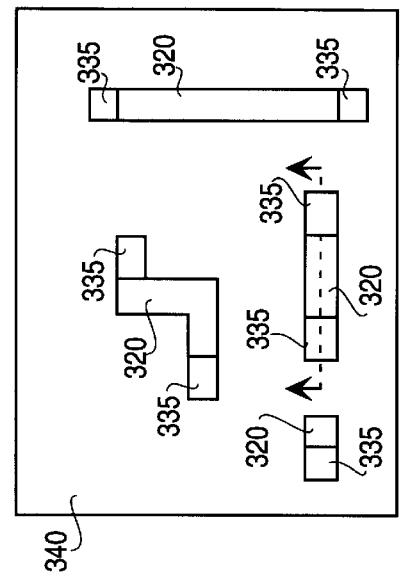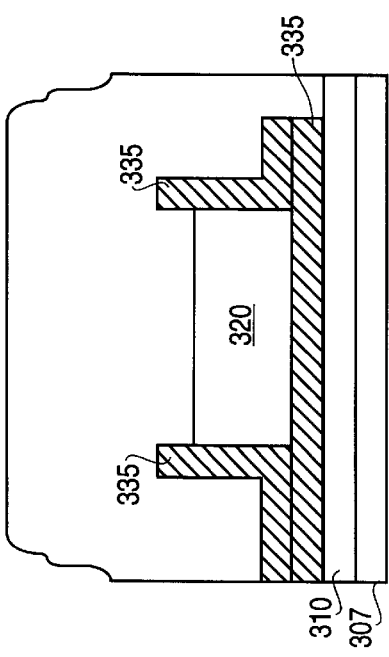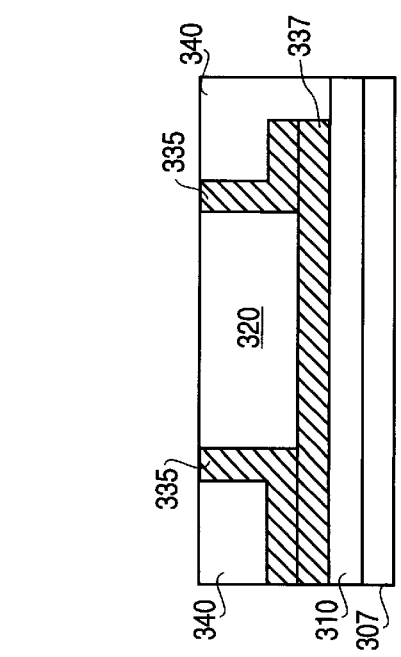
FIG. 28B
FIG. 29B
FIG. 28A
FIG. 29A

METHOD OF FORMING CONTACTS

BACKGROUND OF THE INVENTION

1. Field of the invention

The present invention relates to the field of semiconductor circuit manufacturing, and more specifically, to a method of forming a contact and a novel integrated circuit structure.

2. Discussion of related art

Integrated circuits are made up of millions of active devices formed in or on a silicon substrate. The active devices are interconnected together in order to form functional circuits and components. The devices are interconnected together through the use of multilevel interconnects. A cross-sectional illustration of a typical multilevel interconnect structure 100 is shown in FIG. 1. Interconnect structures normally have a first level of metalization or interconnect layer 105, a second level of metalization 135 and sometimes a third, a fourth, etc., levels of metalization. Interlevel dielectrics 110 (ILDs) such as silicon dioxide ($SiO_2$) are used to electrically isolate different levels of metalization and silicon substrate 101. The electrical connections between different interconnect levels are made through the use of contact holes 115 formed in ILD 110. Contact holes 115 are filled with a conductive material forming contacts 130 which are used to form electrical connections between interconnect levels and devices formed in substrate 101.

As device dimension decreases, an RC delay associated with the interconnects increase. The RC delay increases the propagation delay associated with the interconnects and thus limits the performance of the circuit. The RC delay is mainly due to the capacitive coupling between metal lines and the resistance of contact material used for the interconnects. The capacitive coupling and the interconnect material are limited by the present methods of forming interconnects.

An example of a technique of forming metal-to-metal contacts through contact holes in a multilevel-interconnect system is shown in FIGS. 2A through 7B. Metal lines 105 are formed on substrate 101, as shown in FIG. 2A. Substrate 101 comprises insulating layer 103 formed over silicon substrate 104. FIG. 2B is a top view showing the location desired of electrical contacts on metal lines 105, as represented by X's 102.

Next, as shown in FIG. 3A, ILD 110 is blanket deposited onto substrate 101 and metal lines 105. Then contact holes 115 are formed through ILD 110, as shown in FIG. 4A. FIG. 4B illustrates locations of contact holes 115. In a process to form contact holes, photoresist 120 is generally deposited over ILD 110 and patterned to define desired locations of electrical contacts. Contact holes 115 are then etched in alignment with patterned photoresist layer 120. After contact holes 115 are formed, photoresist layer 120 is removed.

Next, tungsten (W) 125 is blanket deposited over ILD 110 and into contact holes 115, as shown in FIG. 5A. Tungsten 125 is then polished or etched back so that the top of ILD 110 is exposed, forming filled contacts 130, as shown in FIG. 6A. FIG. 6B shows a top view of contacts 130 after their formation.

To complete the process of forming an interconnect level, a second conductive layer is then deposited over the entire surface. Next, a photoresist layer is deposited over the second conductive layer. The photoresist layer is then patterned. Then, exposed portion of the conductive layer is etched to form metal lines 135. The photoresist is then removed. FIG. 7A shows a cross-sectional view of the partially built multilevel interconnect system after formation of metal lines 135. FIG. 7B shows the locations of metal lines 135. Thereafter, the process described for FIG. 2A through FIG. 7B can be repeated to form additional levels of interconnects.

By using the technique described above, an aspect ratio of 2:1 can be achieved. An aspect ratio is defined as contact width 116 over contact height 117 (see FIG. 4A). Separation of metal lines can increase an aspect ratio. As the aspect ratio increases, capacitive coupling between the metal lines decreases and as the capacitive coupling decreases, the RC delay decreases, resulting in better circuit performance. Hence, an aspect ratio that is greater than 2:1 is desirable. Since the contacts are formed by filling contact holes, as the aspect ratio of the contact holes increases, the probability of void formation also increases. Therefore, an aspect ratio that is greater than 2:1 cannot be achieved by using the current technique.

An additional problem with the current technique is that only tungsten can be used to fill contact holes. Tungsten 125 is used in a multilevel-interconnect system because it can be deposited by chemical vapor deposition (CVD). CVD allows a material to be deposited conformally which allows a complete fill of contact holes 115 with an aspect ratio of 2:1. A material with a lower resistance than that of tungsten such as aluminum, copper, gold, silver, and their alloys, is more desirable as a contact material in filling contact holes 115. However, such low resistance materials cannot be used because they can only be reliably deposited by sputtering, rather than by CVD. Sputtering processes typically do not allow a material to be deposited conformally and as a consequence, only contact holes with aspect ratios of less than 2:1 can be filled reliably.

As pointed out above, one method to minimize the RC delay is to decrease the capacitive coupling between metal layers by increasing the distance between the metal layers. However, with the present method in forming contacts, the aspect ratio is limited to 2:1 due to the problem of void formation associated with filling the contact holes. A second way to minimize the RC delay is to use a low resistance contact material. However, low resistance materials such as aluminum, copper, silver, gold and their alloys can only be deposited by sputtering, thus cannot be used to fill contact holes with an aspect ratio of greater than 2:1.

Thus, what is desired is a method of forming a high aspect ratio contact, utilizing low resistance materials.

SUMMARY OF THE INVENTION

An integrated circuit structure and a method of forming a contact is disclosed. A substrate having a desired electrical contact location is provided. The substrate has a conductive layer. A first mask with an edge over the desired electrical contact location is formed on the substrate. A contact material is deposited over the first mask and the substrate. A first portion of the contact material is then removed such that a second portion of the contact material remains to form a contact adjacent to the edge of the mask, over the desired electrical contact location.

BRIEF DESCRIPTION OF THE DRAWINGS

The present invention is shown by way of example and not limitation in the accompanying figures in which:

FIG. 6A is an illustration of a cross-sectional view of contacts formed after planarization of the contact material.

FIG. 6B is an illustration of a top view of the device depicted in FIG. 6A.

FIG. 7A is an illustration of a cross-sectional view of a conductive lines formed after formation of the contacts by depositing a conductive layer and patterning the conductive layer.

FIG. 7B is an illustration of a top view of the device depicted in FIG. 7A.

FIG. 10A is an illustration of a cross-sectional view showing a first mask formed on the substrate, the first mask having an edge that defines the location of the electrical contacts.

FIG. 10B is an illustration of a top view showing location of the first mask and location where electrical contacts are desired.

FIG. 11A is an illustration of a cross-sectional view showing a contact material blanket deposited over the substrate and the first mask.

FIG. 11B is an illustration of a top view of the device depicted in FIG. 11A.

FIG. 22A is an illustration of a cross-sectional view showing a substrate having unpatterned underlying conductive layer.

FIG. 22B is an illustration of a top view showing locations where conductive lines and electrical contacts are desired.

FIG. 23A is an illustration of a cross-sectional view showing a patterned photoresist over an interlayer dielectric layer which is blanket deposited over the substrate.

FIG. 23B is an illustration of a top view showing location of the photoresist.

FIG. 28A is an illustration of a cross-sectional view showing an interlayer dielectric layer deposited over the underlying dielectric layer, first mask and contacts.

FIG. 28B is an illustration of a top view of the device depicted in FIG. 28A.

FIG. 29A is an illustration of a cross-sectional view showing the interconnect device after planarization of the dielectric layer.

FIG. 29B is an illustration of a top view of the device depicted in FIG. 29A.

DETAILED DESCRIPTION OF THE PRESENT INVENTION

The present invention describes a method of forming a contact in an integrated circuit structure. In the following paragraphs, numerous specific details are set forth such as specific materials and processes in order to provide a thorough understanding of the present invention. It will be obvious, however, to one skilled in the art that the present invention may be practiced without these specific details. In other instances, well-known manufacturing materials and processes have not been set forth in detail in order to avoid obscuring the present invention.

The present invention describes a novel method of forming high aspect ratio contacts in an integrated circuit. According to the present invention, a dielectric layer (e.g. oxide, nitride) is blanket deposited over a substrate. A photoresist layer is then deposited over the dielectric layer and patterned to form a first mask which has an edge that defines a desired location for a contact. Next, a contact material is deposited over the first mask. The contact material is then removed by masking and etching to leave only a portion of the contact material adjacent to the edge of the first mask and over the location where electrical contacts are desired. The present invention allows the fabrication of high aspect ratio contacts which decrease capacitive coupling between metal layers and therefore decrease the RC delay associated with the contact structure. Additionally, the process of the present invention allows low resistance materials such as aluminum, copper, silver, gold, and their alloys to be used as contacts which further reduce the RC delay associated with the contact structure.

Figure 8A:
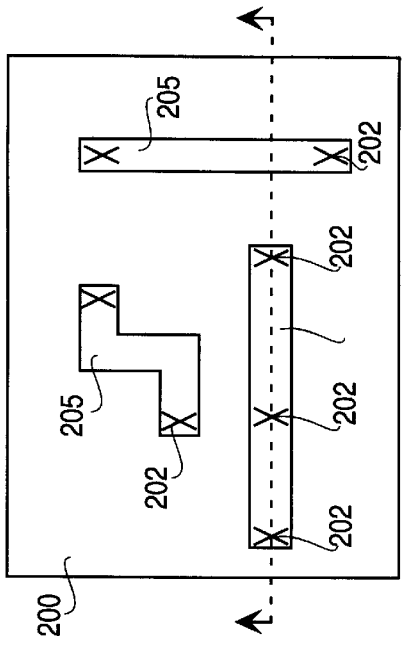
FIG. 8A is an illustration of a cross-sectional view of a substrate with conductive lines that are in planar with the underlying dielectric layer.
Figure 8B:
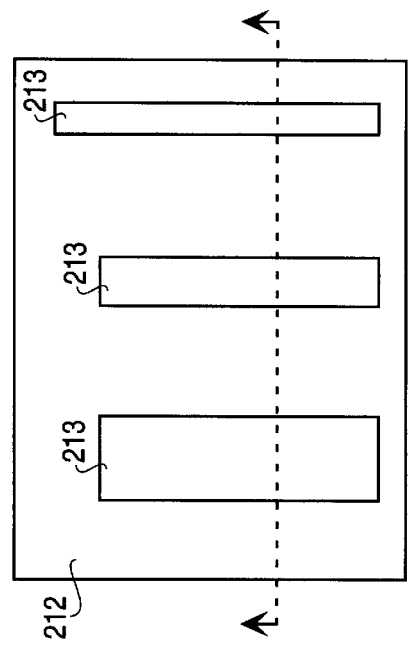
FIG. 8B is an illustration of a top view showing locations where electrical contacts are desired.

An example of the present invention is shown in FIGS. 8A through 17B. A substrate 200 is provided. According to the present invention, substrate 200 is the starting material on which layers are deposited and processes are performed. Substrate 200 typically includes a semiconductor substrate 201, underlying dielectric layer (ILD) 203 and conductive lines 205. Substrate 201 is typically a semiconductor substrate which includes active and passive devices such as transistors, capacitors and resisters formed therein. The semiconductor substrate can be comprised of materials such as, but not limited to, silicon, silicon germanium, or gallium-arsenite. Other substrates such as a substrate used for a flat panel display may be utilized if desired. An ILD 203 is generally formed on top of substrate 201 to isolate conductive lines 205 from the active devices contained in substrate 201 below. In one embodiment, conductive lines 205 are formed in planar with ILD 203, as shown in FIG. 8A. Conductive lines 205 however, need not necessarily be formed coplanar with ILD 203. In one embodiment, protective caps 210 are formed as an integral part of conductive lines 205. The benefit protective caps 205 provide is discussed later. Conductive lines 205 typically comprise a low resistance material or alloy such as, but not limited to, aluminum, copper, silver, gold and their alloys. FIG. 8B shows locations where electrical contacts are desired on conductive lines 205, as represented by X's 202.

Figure 9A:
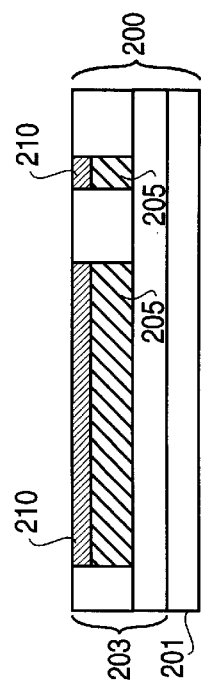
FIG. 9A is an illustration of a cross-sectional view showing a patterned photoresist over an interlayer dielectric layer which is blanket deposited over the substrate.
Figure 9B:
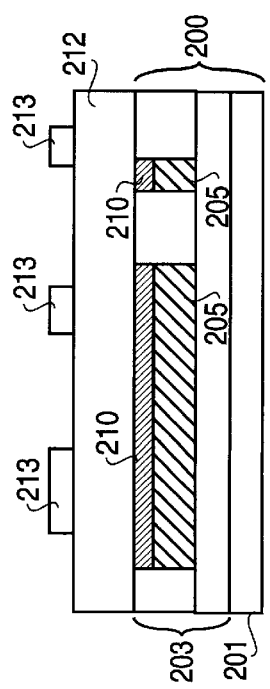
FIG. 9B is an illustration of a top view showing location of the photoresist.

A dielectric layer 212 is then blanket deposited over substrate 200, by well known techniques, such as chemical vapor deposition. The thickness of dielectric layer 212 is generally determined by the height of the contact desired. The final height of the contact is determined in the subsequent planarization step which is discussed later. Dielectric layer 212 typically has a thickness of 0.8–2 $\mu$m. A photoresist layer is then formed on top of dielectric layer 212 and patterned to define the location of first mask 215, as shown in FIG. 9A. FIG. 9B is a top view showing location of photoresist 213.

The exposed portion of dielectric layer 212 is then etched to form first mask 215. First mask 215 provides an edge 217 over the location where an electrical contact is desired, as shown in FIG. 10A and FIG. 10B. A contact is eventually formed adjacent to edge 217. In one embodiment of the present invention, first mask 215 remains to form part of the ILD. First mask 215 needs to be sturdy enough to withstand subsequent etchings. In one embodiment, first mask 215 comprises $SiO_2$ because $SiO_2$ is robust, thus is able to withstand subsequent etchings during the process to form the contacts. Another advantage of using $SiO_2$ is that $SiO_2$ is a commonly used ILD material. This is beneficial because in one embodiment, first mask 215 may be left to form part of the ILD. Therefore, $SiO_2$ is preferably selected as a typical material for first mask 215. After etching, the photoresist is removed. FIG. 10B shows first mask 215 having edge 217 which is over the location where electrical contacts are desired, as represented by X's 202.

Conductive contact material 220 is then blanket deposited over substrate 200 and first mask 215, as shown in FIG. 11A. The thickness of contact material 220 depends on the width of the contact desired. Contact material 220 is preferably a low resistance material, e.g. aluminum. However, contact material 220 can be other electrically conductive low resistance material such as, but not limited to, copper, silver, gold, and their alloys. Hence, the same material can be used for both conductive lines 205 and contacts 235. It is to be appreciated that aluminum, copper, silver, gold, and their alloys were not used for contact material 220 in prior art because only CVD-deposited material could be reliably used to fill contact holes having an aspect ratio greater than 2:1. Since contacts are formed without filling contact holes in the present invention, deposition of contact material 220 need not be conformal and sputter-deposited materials such as aluminum, copper, silver, gold, and their alloys are allowed. By being able to use materials with lower resistance than tungsten, the resistive component contributory to the RC delay can be effectively reduced, thus improving the circuit performance.

Figure 12A:
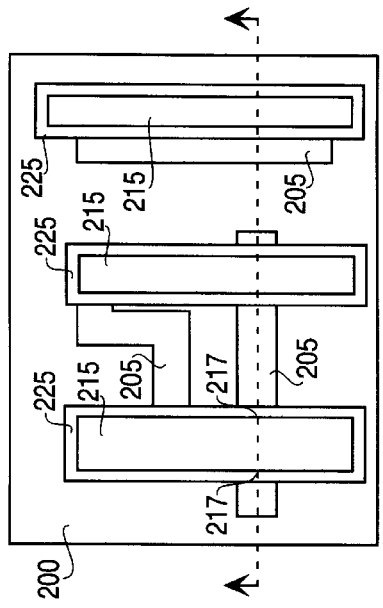
FIG. 12A is an illustration of a cross-sectional view showing a contact spacer formed at the edge of the first mask after reactive ion etchback of the contact material.
Figure 12B:
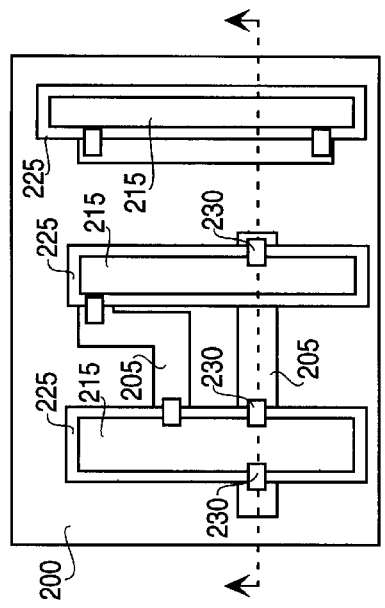
FIG. 12B is an illustration of a top view showing a contact spacer adjacent to and around the first mask.

Next, referring to FIG. 12A, conductive contact material 220 is anisotropically etched so that contact material 220 is removed from the top of first masks 215 and between first masks 215 such that the remaining portion of conductive contact material 220 forms a contact spacer 225 adjacent to and around first mask 215, as shown in FIG. 12B. One of the anisotropic etching process can be carried out by a well known method such as reactive ion etching. During the etching step, overetching is desired to ensure that all conductive contact material 220 is removed except contact spacer 225 material that is adjacent to and around first mask 215. Removing all conductive contact material 220 from top of first masks 215 and between contact spacers 225 is necessary so that leftover residue does not cause short circuits between devices.

Protective cap 210 formed on top of conductive lines 205 is beneficial in preventing over-etching of underlying conductive lines 205 since underlying conductive lines 205 may be subject to etchant attack during an etchback, especially if contact spacer 225 comprises the same material as conductive lines 205. A protective cap 210 is preferably formed of a material which can be selectively etched with respect to the spacer material. As shown in FIG. 12A, underlying conductive lines 205 beneath protective cap 210 is not etched in the process of forming contact spacer 225. Protective cap 210 may be comprised of a material that prevents, or retards, the tendency of electron migration. If the conductive contact material is aluminum and copper, the protective cap material may be titanium-nitride, titanium-tungsten, titanium, tungsten or other refractory metals.

Figure 13A:
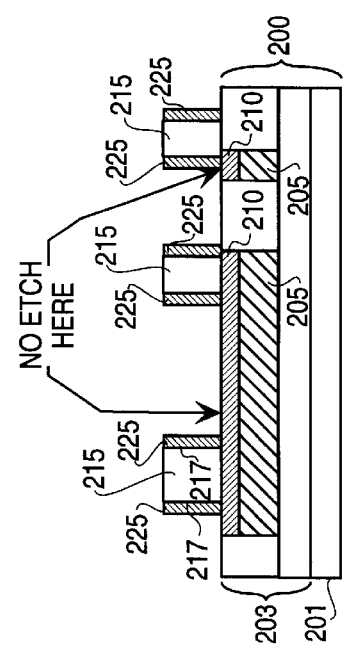
FIG. 13A is an illustration of a cross-sectional view showing second masking step to define the location of the contacts.
Figure 13B:
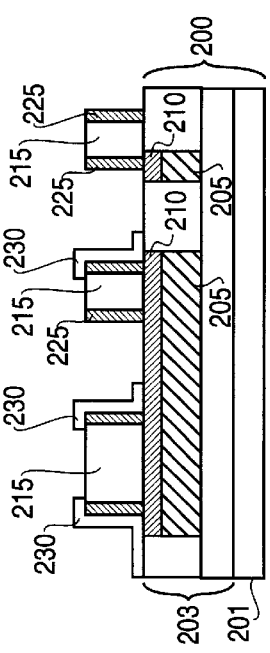
FIG. 13B is an illustration of a top view showing location of the second mask.

Once contact spacer 225 has been formed, a second mask 230 is formed over contact spacer 225 to define a contact area over locations where electrical contacts are desired, as shown in FIG. 13A. FIG. 13B shows locations of second mask 230 covering areas of contact spacer 225 where electrical contacts are desired. In forming second mask 230 over contact spacer 225, a photoresist layer can generally be deposited and patterned to cover only the areas where electrical contacts are desired. Top surface imaging lithography technique may be used to overcome the severe topography problem.

Figure 14B:
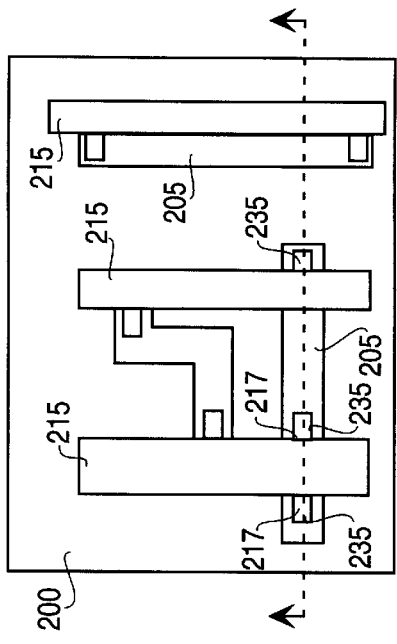
FIG. 14B is an illustration of a top view of the device depicted in FIG. 14A.
Figure 15B:
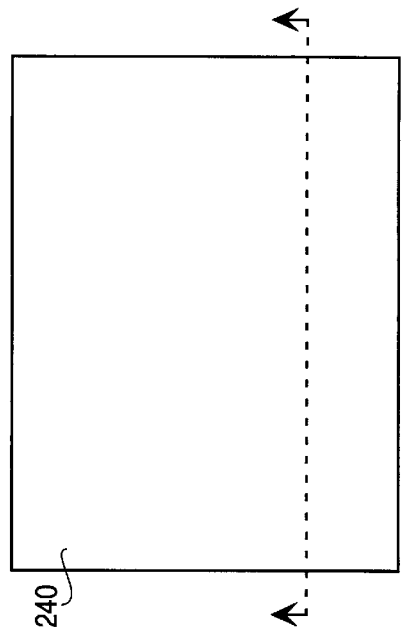
FIG. 15B is an illustration of a top view of the device depicted in FIG. 15A.
Figure 14A:
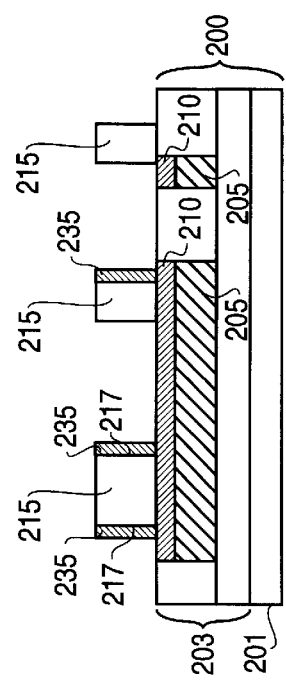
FIG. 14A is an illustration of a cross-sectional view showing contacts formed at appropriate locations after etching.

Next, contact spacer 225 is etched in alignment with second mask 230 to remove contact spacer 225 material except that portion of contact spacer 225 covered by second mask 230 to form contacts 235. After the etch, only the conductive contact material covered by second mask 230 remains as contacts 235, as shown in FIG. 14A. Second mask 230 is then removed. FIG. 14B shows a top view of contacts 235 adjacent to edge 217 and over the location where electrical contacts are desired.

Figure 15A:
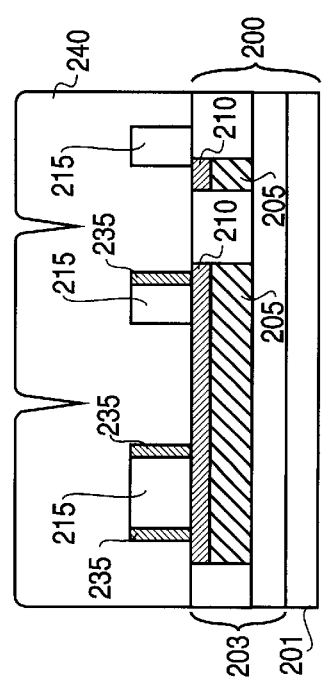
FIG. 15A is an illustration of a cross-sectional view showing a dielectric layer blanket deposited over the substrate, first mask and contacts.
Figure 16B:
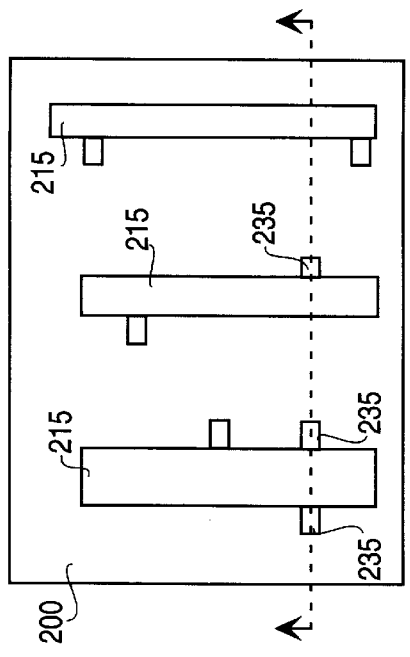
FIG. 16B is an illustration of a top view of the device depicted in FIG. 16A.
Figure 16A:
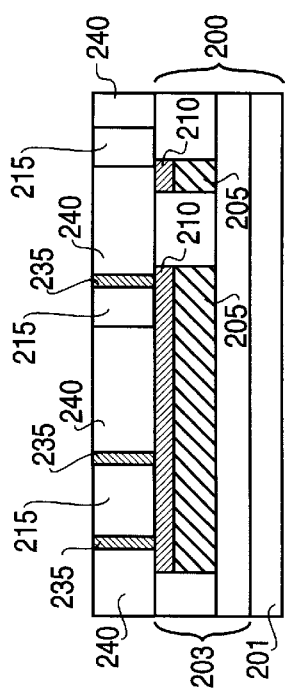
FIG. 16A is an illustration of a cross-sectional view showing the interconnect device after planarization of the dielectric layer.

Next, according to one embodiment of the present invention, ILD 240 is blanket deposited over first mask 215, contacts 235, and substrate 200, as shown in FIG. 15A. ILD 240 is then planarized to reveal contacts 235, as shown in FIG. 16A. The planarization step determines the final height of contacts 235. One method of the planarization process may be chemical-mechanical polishing (CMP). Although CMP is preferred, other techniques such as etchback may be utilized to planarize ILD 240. It is appreciated that ILD 240 is completely removed from the top portion of contacts 235 to ensure a good contact with the subsequent conductive layer. FIG. 16B shows a top view of the partially built multilevel interconnect system after the planarization step with top of contacts 235 visible.

Figure 17B:
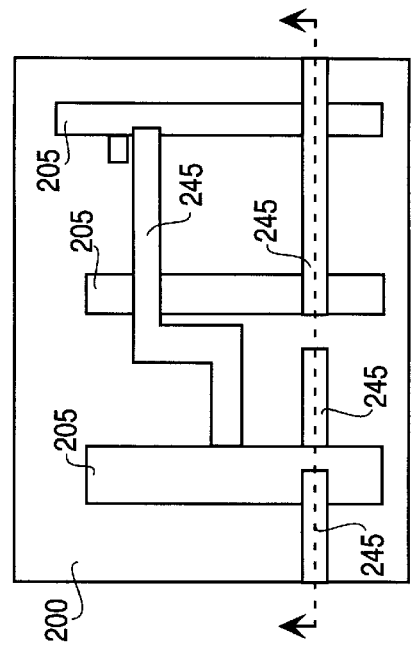
FIG. 17B is an illustration of a top view showing location of the conductive lines.
Figure 17A:
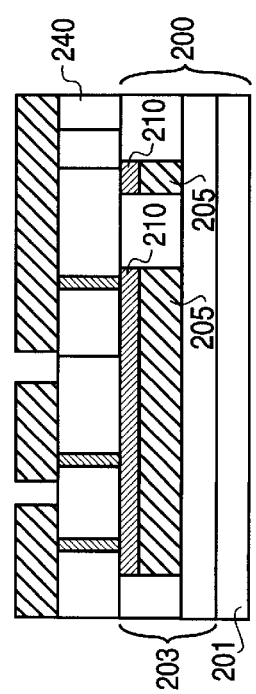
FIG. 17A is an illustration of a cross-sectional view showing conductive lines formed after formation of the contacts by depositing a conductive layer and patterning the conductive layer.

Then, a second level of interconnection is formed over ILD 240 and contacts 235 using a well-known technique. For example, a conductive layer can be blanket deposited over the structure shown in FIG. 16A. A photoresist layer can then be blanket deposited over the conductive layer. The photoresist layer is masked, exposing portion of the conductive layer which is then etched to form conductive lines 245, as shown in FIG. 17A. FIG. 17B shows a top view illustrating location of conductive lines 245. The process described in FIG. 8A through FIG. 17B is repeated to form more devices and interconnects.

As illustrated in FIG. 17A, contacts 235 with aspect ratios greater than 2:1 can be easily formed. The present invention forms a contact by blanket depositing a contact material, then etchback that contact material. As such, contacts with aspect ratio greater than 5:1 are possible. The prior art, on the other hand, forms a contact by forming a contact hole, then filling the contact hole. As discussed earlier, the higher the contact hole, the worse the incomplete fill problem becomes. In addition, only tungsten can be used to reliably fill a contact hole with an aspect ratio of 2:1 because no low resistance material can be deposited by CVD. By using the present invention, contacts are not formed by filling contact holes, and problems associated with contact hole filling no longer exist. Contacts as high as desired can be manufactured reliably, even with a low resistance contact material. Low resistance contact material can be used because there are no holes to fill, thus CVD deposition is not required. By increasing the aspect ratio, capacitive coupling between the conductive lines is reduced, thereby improving circuit performance.

Figure 18A:
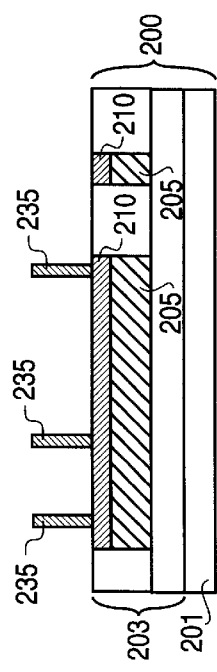
FIG. 18A is an illustration of a cross-sectional view showing the substrate and contact after removal of the first mask.
Figure 18B:
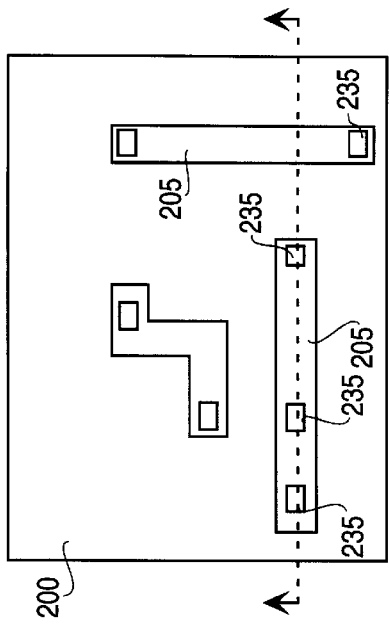
FIG. 18B is an illustration of a top view showing location of the contacts and the conductive lines.

In another embodiment of the present invention, the steps are the same as those described for FIG. 8A up to FIG. 14B. Thereafter, in the present embodiment, first mask 215 is removed, leaving just contacts 235, as shown in FIG. 18A. First mask 215 can be removed, for example, by plasma etching. Care must be taken not to remove contacts 235 when removing First mask 215.

Figure 19A:
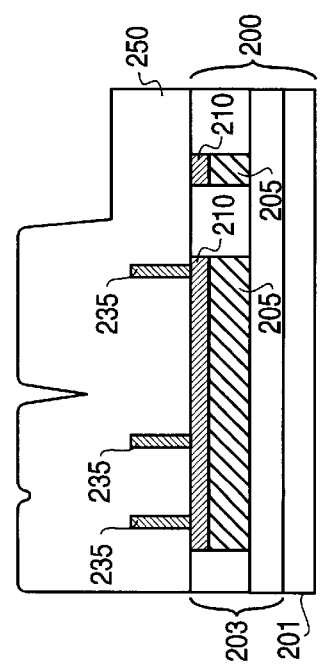
FIG. 19A is an illustration of a cross-sectional view showing a dielectric layer blanket deposited over the substrate and the contacts.
Figure 19B:
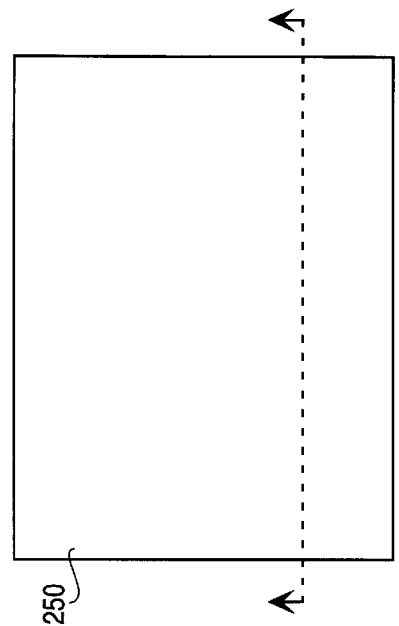
FIG. 19B is an illustration of a top view of the device depicted in FIG. 19A.

ILD 250 is then deposited over contacts 235 and substrate 200, as shown in FIG. 19A. ILD 250 is preferably a low dielectric constant material such as, but not limited to, polyimides. Polyimides have a dielectric constant of 3.2–3.4 which is less than that of either $SiO_2$ (3.5–4.0) or silicon nitride (6.0–9.0). A low dielectric constant material keeps the capacitance between conductive layers low. As discussed earlier, low capacitance is an essential element in reducing the RC delay which helps to optimize the performance of the integrated circuit.

Figure 20B:
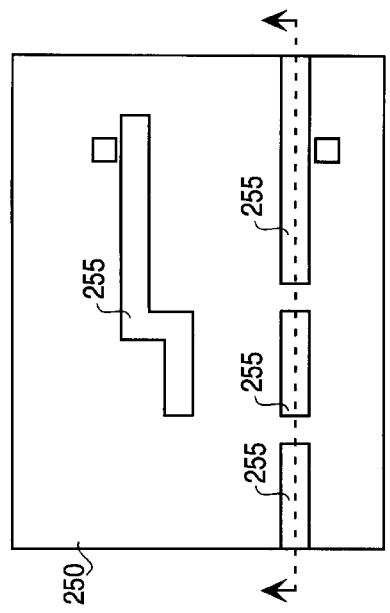
FIG. 20B is an illustration of a top view of the device depicted in FIG. 20A.
Figure 20A:
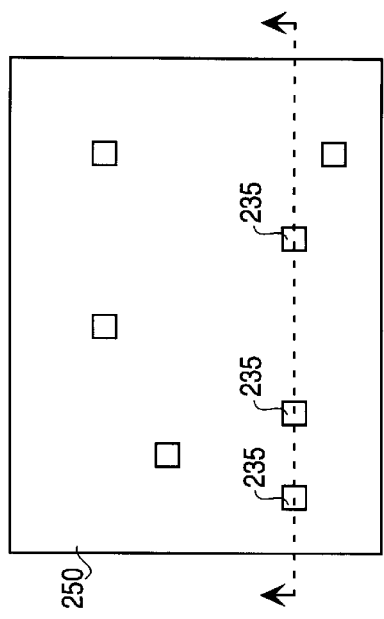
FIG. 20A is an illustration of a cross-sectional view showing the interconnect device after planarization of the dielectric layer.

Next, ILD 250 is planarized to reveal contacts 235, as shown in FIG. 20A. FIG. 20B shows a top view of the partially built multilevel interconnect system after the planarization step with top of contacts 235 visible.

Figure 21B:
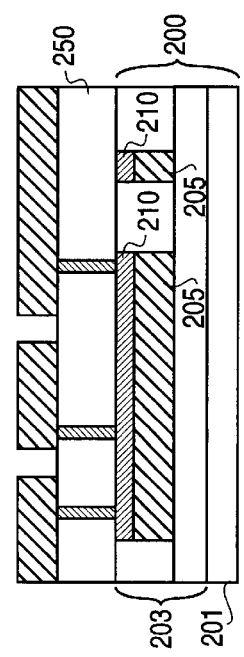
FIG. 21B is an illustration of a top view showing location of the conductive lines.

Then, a second level of interconnection is formed over ILD 250 and contacts 235 using a well-known technique as described above. FIG. 21B shows a top view illustrating location of conductive lines 255. The process described in FIG. 8A through FIG. 14B and FIG. 18A through FIG. 21B is repeated to form more devices and interconnects.

Figure 21A:
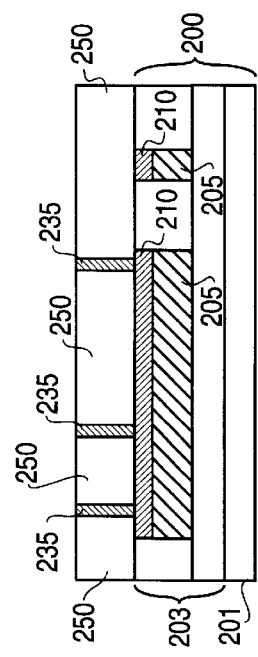
FIG. 21A is an illustration of a cross-sectional view showing conductive lines formed after formation of the contacts by depositing a conductive layer and patterning the conductive layer.
Figure 24B:
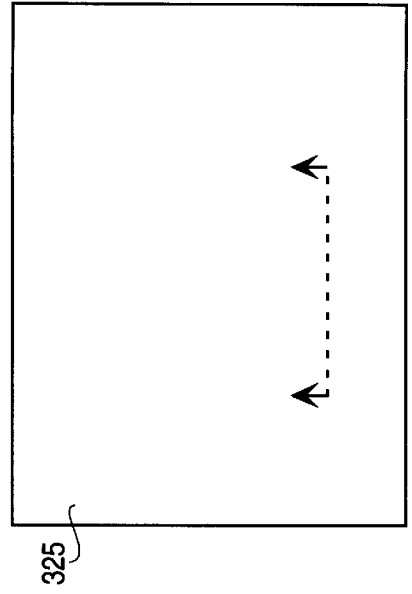
FIG. 24B is an illustration of a top view showing location of the first mask and location where electrical contacts are desired.
Figure 24A:
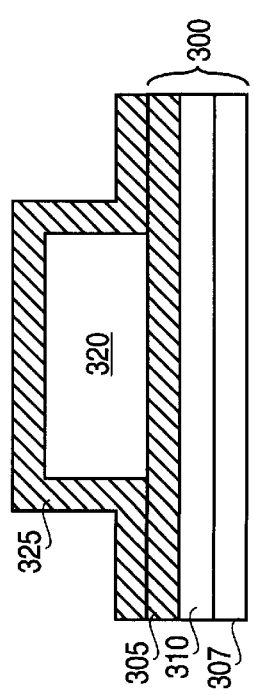
FIG. 24A is an illustration of a cross-sectional view showing a first mask formed on the substrate, the first mask having an edge that defines the location of the electrical contacts.

As illustrated in FIG. 21A, ILD 250 is comprised of a low dielectric constant material, rather than a combination of first mask 215 and ILD 240, as shown in FIG. 17A. By using a low dielectric constant material uniformly for ILD 250, as shown in FIG. 21A, capacitive coupling between the conductive lines can be further reduced, thus reducing the RC delay.

Another embodiment of the present invention is shown in FIGS. 22A through 30B. A substrate 300 is provided. Substrate 300 is similar to substrate 200 described earlier. According to the present invention, substrate 300 typically includes a semiconductor substrate 307, an unpatterned underlying conductive layer 305 and an underlying dielectric layer 310. FIG. 22B shows desired conductive line pattern 315, as illustrated by the dashed lines and locations where electrical contacts are desired, as illustrated by X's 302.

Figure 25B:
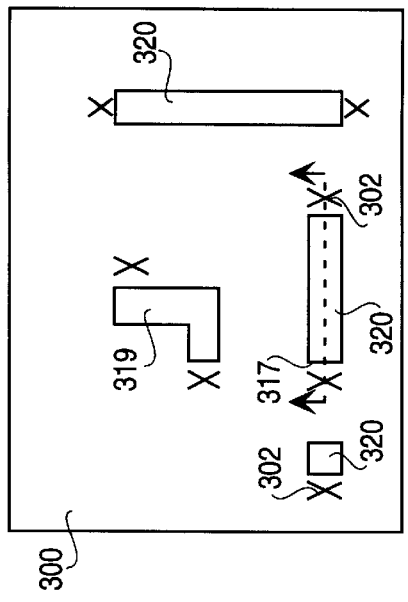
FIG. 25B is an illustration of a top view of the device depicted in FIG. 25A.
Figure 25A:
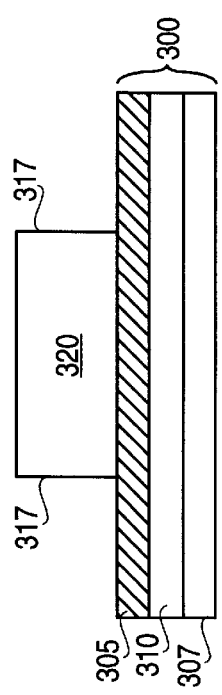
FIG. 25A is an illustration of a cross-sectional view showing a contact material blanket deposited over the substrate and the first mask.

Steps 23A through 25B are same as steps 9A through 11A of the first embodiment. Dielectric layer 316 is blanket deposited over substrate 300. A photoresist layer 319 is then formed on top of dielectric layer 316 and patterned to define the location of first mask 320, as shown in FIG. 23A. The exposed portion of dielectric layer 316 is then etched to form first mask 320. In one embodiment of the present invention, first mask 320 remains to form part of the ILD. After etching, photoresist 319 is removed. Conductive contact material 325 is then blanket deposited over substrate 300 and first mask 320, as shown in FIG. 25A.

Figure 26A:
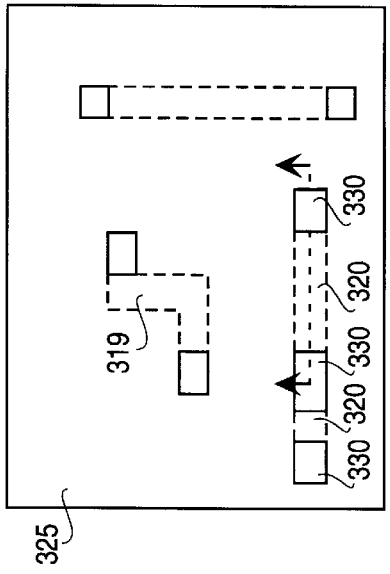
FIG. 26A is an illustration of a cross-sectional view showing the second mask covering areas of desired underlying conductive layer pattern and contact areas that are not covered by the first mask.
Figure 26B:
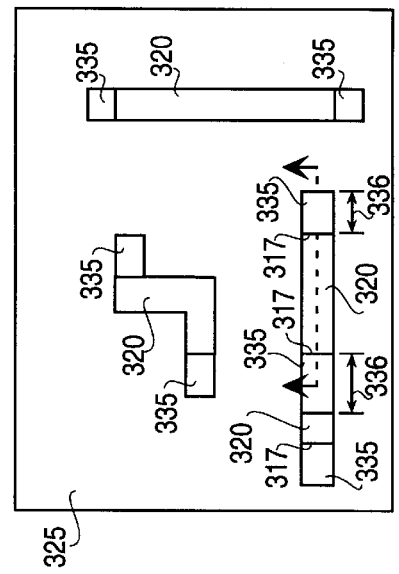
FIG. 26B is an illustration of a top view showing location of the first mask and the second mask.

Next, a photoresist is formed on top of contact material 325 and patterned such that second mask 330 is formed to cover a conductive line pattern that is not yet covered by first mask 320, as shown in FIG. 26A. FIG. 26B shows locations of second mask 330. The dashed lines represent first mask 320 which is covering part of the conductive line pattern.

Figure 27A:
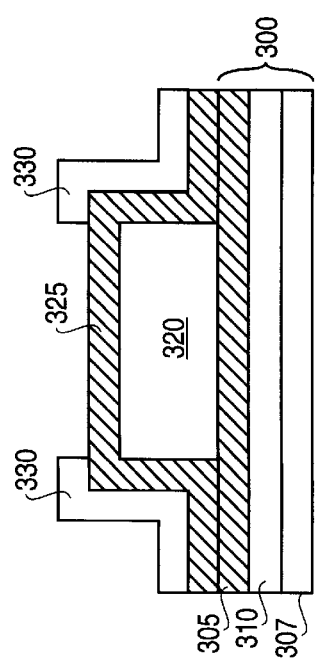
FIG. 27A is an illustration of a cross-sectional view showing contacts and patterned underlying conductive layer.

Then, contact material 325 and underlying conductive layer 305 are etched in alignment with first mask 320 and second mask 330, forming contacts 335 and patterning conductive lines 337, as shown in FIG. 27A. First mask 320 and second mask 330 collectively form a combined mask which defines a location for conductive lines 337. During the etching step, the portion of underlying conductive layer 305 that is not covered by first mask 320 nor second mask 330 is etched away. The remaining portion of underlying conductive layer 305 defines conductive lines 337. It is appreciated that first mask 320 and second mask 330 combine to define a single feature, namely, conductive lines 337.

FIG. 27A illustrates that contacts 335 are formed as integrated parts of conductive lines 337. Conductive lines 337 may be comprised of multi-layer metals. First mask 320 defines the location of contacts 335 by providing edges where contacts 335 are eventually formed, as discussed above. Second mask 330 defines the location and lengths 336 of the integrated parts. During etching, the portion of contact material 325 not covered by second mask 330 is etched away. The remaining portion of contact material 325 forms contacts 335. Thus, the combined mask of first mask 320 and second mask 330 defines location and length 336 of contacts 335. By forming contacts 335 as integrated parts of underlying conductive lines 337, via delamination problem is reduced.

Figure 27B:
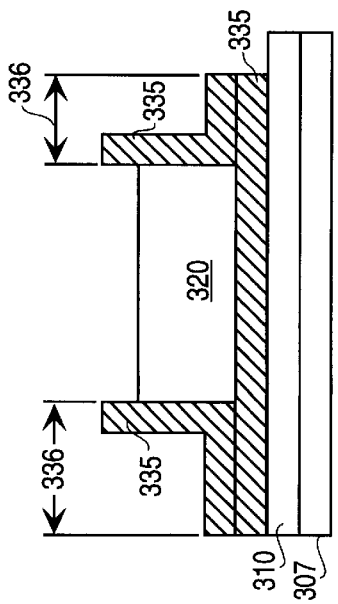
FIG. 27B is an illustration of a top view of the device depicted in FIG. 27A.
Figure 30B:
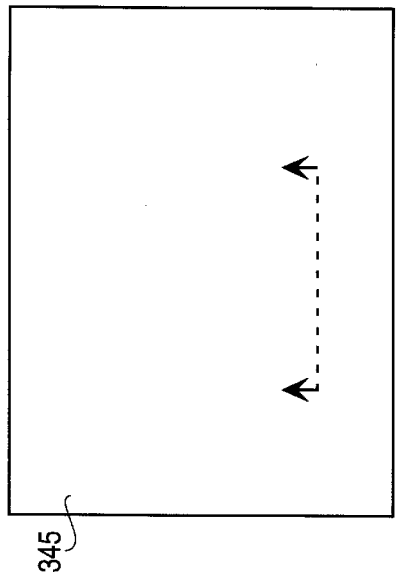
FIG. 30B is an illustration of a top view of the device depicted in FIG. 30A.

As pointed out above, first mask 320 and second mask 330 are comprised of materials that are hardy enough to withstand subsequent etchings. Therefore, only the portion of the conductive material not covered by either mask is etched away. It will be appreciated that only two masks are needed both to pattern underlying conductive lines 337 and to form contacts 335. Second mask 330 is removed after etching. FIG. 27B shows the location of contacts 335 and first mask 320, which combined, show the pattern of conductive lines 337.

Next, according to one embodiment of the present invention, an ILD 340 is blanket deposited over first mask 320, contacts 335, and underlying dielectric layer 310, as shown in FIG. 28A. ILD 340 is then planarized to reveal contacts 335, as shown in FIG. 29A. This planarization step determines the final height of contacts 335.

Next, a second level of interconnection is formed over ILD 340 and contacts 335 with well-known technique. For example, a conductive layer 345 can be blanket deposited over the structure shown in FIG. 29A. The process described in FIG. 22A through FIG. 30B is repeated to form more devices and interconnects.

Figure 1:
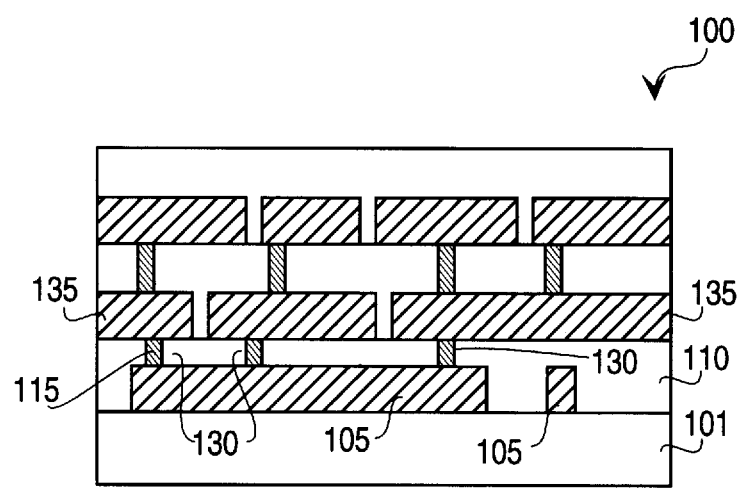
FIG. 1 is an illustration of a cross-sectional view of a multilevel-interconnect structure.
Figure 2B:
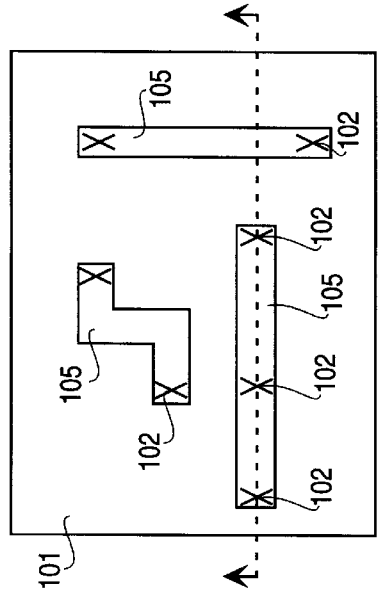
FIG. 2B is an illustration of a top view of the device depicted in FIG. 2A.
Figure 3B:
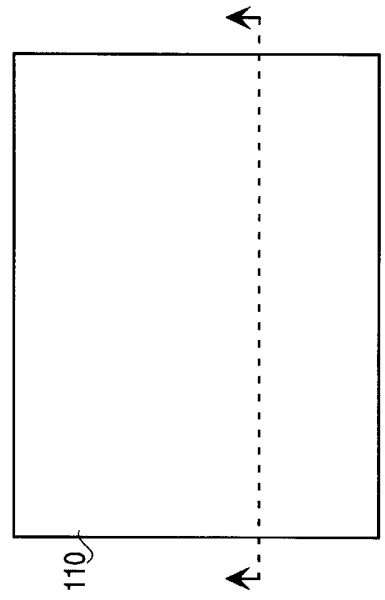
FIG. 3B is an illustration of a top view of the device depicted in FIG. 3A.
Figure 2A:
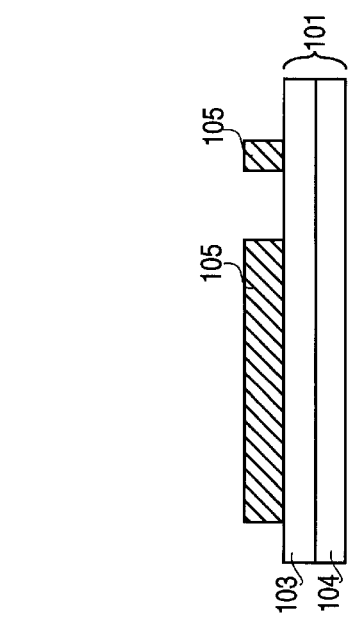
FIG. 2A is an illustration of a cross-sectional view of a substrate with conductive lines formed on top.
Figure 3A:
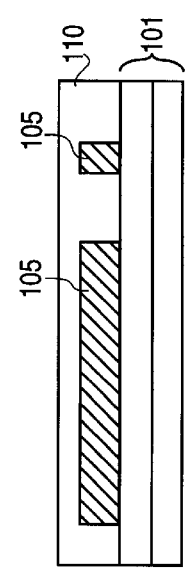
FIG. 3A is an illustration of a cross-sectional view of a dielectric layer blanket deposited over the substrate and the conductive lines.
Figure 4B:
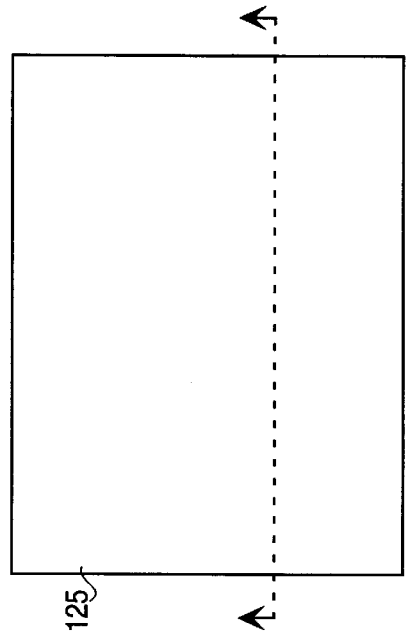
FIG. 4B is an illustration of a top view of the device depicted in FIG. 4A.
Figure 5B:
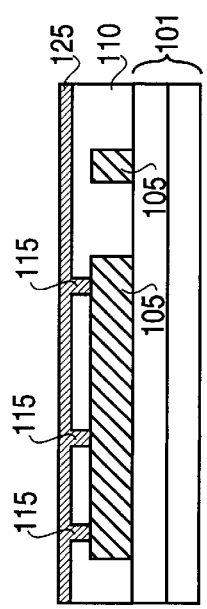
FIG. 5B is an illustration of a top view of the device depicted in FIG. 5A.
Figure 4A:
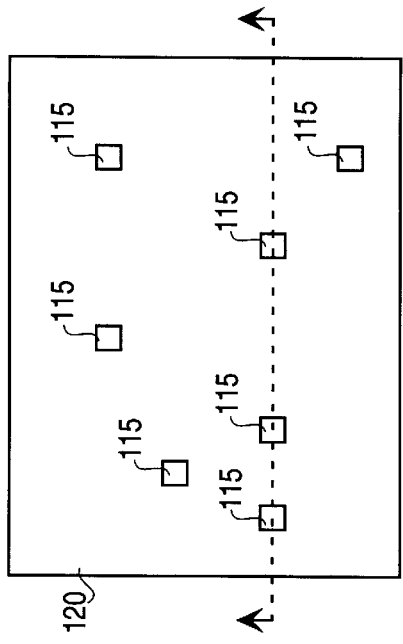
FIG. 4A is an illustration of a cross-sectional view of a patterned photoresist formed on top of the dielectric layer and contact holes after etching.
Figure 5A:
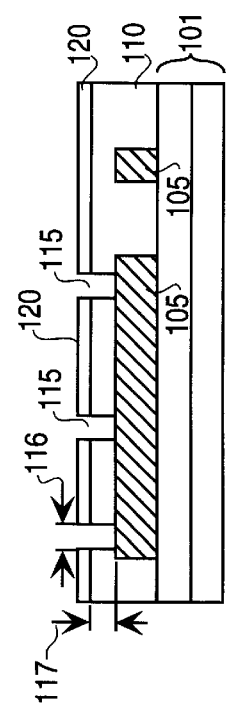
FIG. 5A is an illustration of a cross-sectional view of a contact material deposited over the dielectric layer and into the contact holes, after removal of the photoresist.
Figure 30A:
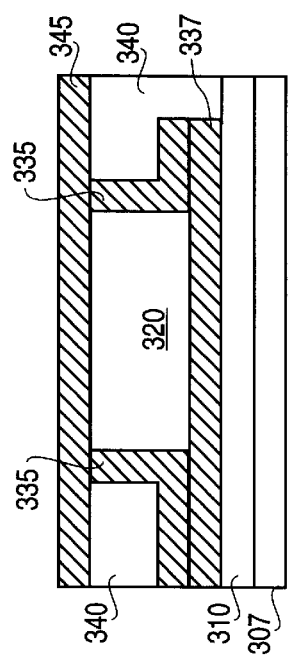
FIG. 30A is an illustration of a cross-sectional view showing a second conductive layer blanket deposited after planarization.

As illustrated in FIG. 30A, contacts 335 with aspect ratios that are greater than 2:1 are easily manufactured. An aspect of how contacts manufactured using the method described for FIGS. 20A through 30B differ from the traditional contacts is the shape of the contacts. In the present invention, contacts 335 are formed as integrated parts of underlying conductive lines 337, as opposed to the traditional pillar-shaped contacts illustrated, for example, in FIG. 1 and FIG. 17A. The structure in the present invention is advantageous because via delamination problem is reduced. Another advantage is that there is no protective cap layers necessary for this method. The contact resistance can be greatly reduced if the contact and underlying metal are the same (e.g., aluminum).

Figure 31B:
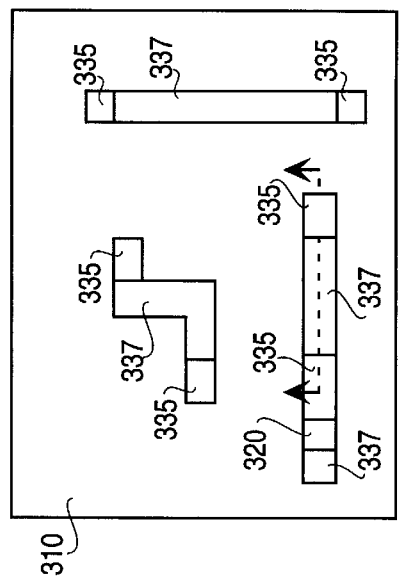
FIG. 31B is an illustration of a top view showing location of the contacts and the conductive lines.
Figure 31A:
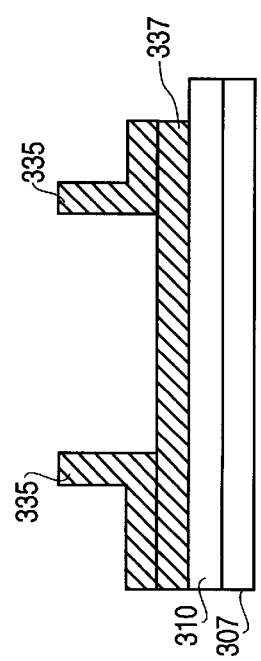
FIG. 31A is an illustration of a cross-sectional view showing the conductive lines and contact after removal of the first mask.
Figure 32B:
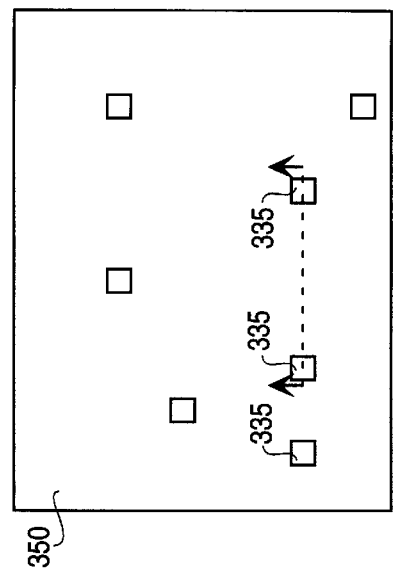
FIG. 32B is an illustration of a top view of the device depicted in FIG. 32A.
Figure 32A:
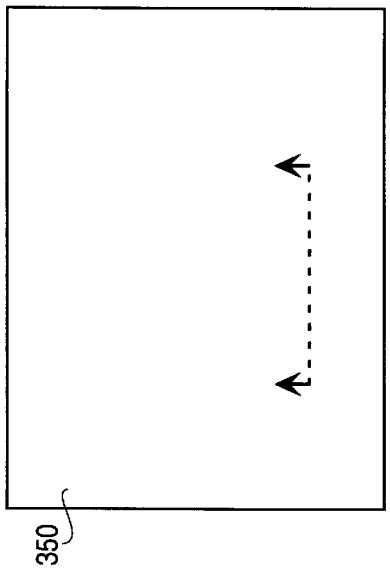
FIG. 32A is an illustration of a cross-sectional view showing a dielectric layer blanket deposited over the underlying dielectric layer, conductive lines and the contacts.
Figure 33B:
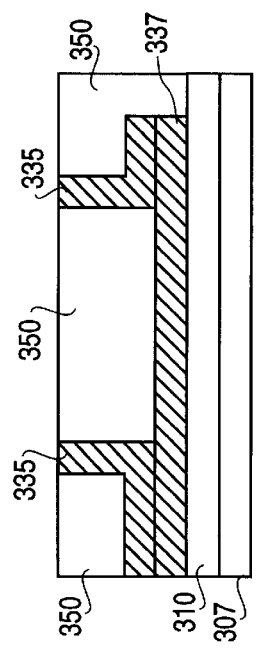
FIG. 33B is an illustration of a top view showing location of the contacts.
Figure 33A:
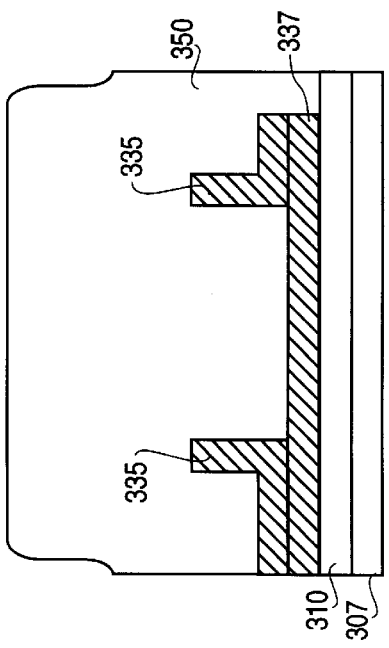
FIG. 33A is an illustration of a cross-sectional view showing the interconnect device after planarization of the dielectric layer.
Figure 34B:
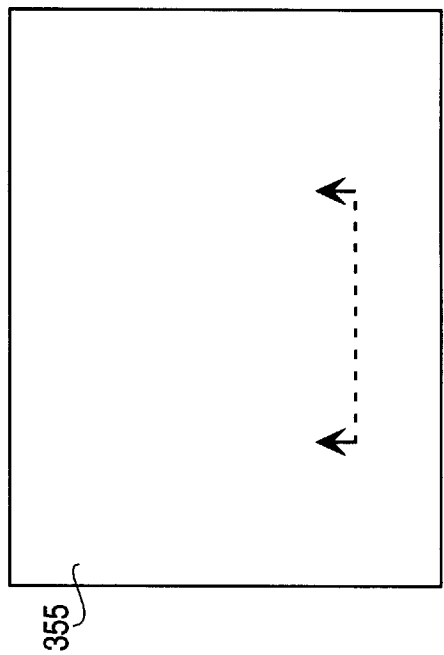
FIG. 34B is an illustration of a top view of the device depicted in FIG. 34A.
Figure 34A:
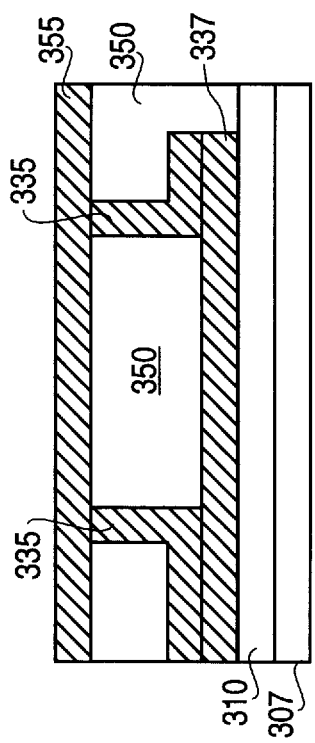
FIG. 34A is an illustration of a cross-sectional view showing a conductive layer blanket deposited after planarization.

In another embodiment of the present invention, the steps are the same as those described for FIG. 20A up to FIG. 27B. Thereafter, in the present embodiment, first mask 320 is removed, leaving just contacts 335, as shown in FIG. 31A. ILD 350 is then deposited over contacts 335, underlying conductive lines 337, and underlying dielectric layer 310, as shown in FIG. 32A. Next, ILD 350 is planarized to reveal contacts 335, as shown in FIG. 33A. FIG. 33B shows a top view of the partially built multilevel interconnect system after the planarization step with top of contacts 335 visible. Then, a second level of interconnection 355 is formed over ILD 350 and contacts 335 using well-known techniques, as previously described. The process described in FIG. 22A through FIG. 27B and FIG. 31A through FIG. 34B is repeated to form more devices and interconnects.

Thus, a high aspect ratio contact and fabrication method is disclosed. While the present invention has been described with reference to specific embodiments thereof, many variations of the present invention will be obvious to one skilled in the art and are considered to be within the scope and spirit of the present invention.

What is claimed is:

1. A method of forming a contact, said method comprising the steps of:

providing a substrate having a location where an electrical contact is desired, said substrate having a conductive layer;

forming a first mask over said substrate wherein said first mask has an edge over said location;

depositing a contact material over said substrate and said first mask;

removing a first portion of said contact material so that a second portion of said contact material remains adjacent to said edge and over said location, defining a contact;

after removing said first portion of said contact depositing a dielectric layer over said first mask, said contact, and said substrate; and removing a top portion of said dielectric layer to reveal said contact.

2. The method of claim 1 wherein said dielectric layer has a dielectric constant less than silicon dioxide.

3. The method of claim 1 wherein said step of removing a top portion of said dielectric layer includes chemical mechanical polishing.

4. A method of forming a contact, said method comprising the steps of:

providing a substrate having a location where an electrical contact is desired, said substrate having a conductive layer;

forming a first mask over said substrate wherein said first mask has an edge over said location;

depositing a contact material over said substrate and said first mask; and removing a first portion of said contact material so that a second portion of said contact material remains adjacent to said edge and over said location, defining a contact;

removing said first mask;

depositing a dielectric layer over and around said contact; and removing a top portion of said dielectric layer to reveal said contact.

5. The method of claim 4, wherein said step of removing a top portion of said dielectric layer includes chemical mechanical polishing.

6. The method of claim 4, wherein said dielectric layer comprises a material having a dielectric constant less than silicon dioxide.

7. A method of forming a contact, said method comprising the steps of:

providing a substrate having a location where an electrical contact is desired, said substrate having a conductive layer;

forming a first mask over said substrate wherein said first mask has an edge over said location;

depositing a contact material over said substrate and said first mask; and removing a first portion of said contact material so that a second portion of said contact material remains adjacent to said edge and over said location, defining a contact;

wherein the step of removing a first portion of said contact material comprises the steps of:

anisotropic etching said contact material so that the top of said first mask is exposed and a remaining portion of said contact material defines a contact spacer around said first mask;

forming a second mask over a portion of said contact spacer to define a contact area over said location; and an exposed portion of said contact spacer and etching said exposed portion of said contact spacer in alignment with said second mask to form a contact adjacent to said edge and over said location.

8. The method of claim 7, wherein the step of anisotropic etching comprises reactive ion etching.

9. A method of forming a contact, said method comprising the steps of:

providing a substrate having a location where an electrical contact is desired, said substrate having a conductive layer;

forming a first mask over said substrate wherein said first mask has an edge over said location;

depositing a contact material over said substrate and said first mask; and removing a first portion of said contact material so that a second portion of said contact material remains adjacent to said edge and over said location, defining a contact;

wherein removing said contact material comprises the steps of:

forming a second mask over said contact material to define a contact area adjacent to said edge; and etching said contact spacer in alignment with said second mask to form a contact adjacent to said edge and over said location.

10. The method of claim 9, wherein said step of etching comprises anisotropic etch.

11. The method of claim 1, wherein said first mask comprises silicon dioxide.

12. The method of claim 7 wherein said second mask comprise photoresist.

13. The method of claim 1, wherein said contact material and said conductive layer comprise the same material.

14. The method of claim 1, wherein said contact material comprises aluminum.

15. The method of claim 1, wherein said contact has an aspect ratio of at least 3.

16. A method of forming a contact, said method comprising the steps of:

providing a substrate having a conductive layer with a location on which an electrical contact is desired;

forming a mask layer over said substrate;

patterning said mask layer to create a first mask, having an edge over said location;

blanket depositing a conductive contact material over said substrate and said first mask;

anisotropic etching said conductive contact material so that the top of said first mask is exposed and the remaining portion of said conductive contact material forms a contact spacer adjacent to and around said first mask;

forming a second mask over a portion of said contact spacer to define a contact area over said location; and to define an exposed portion of said contact spacer and etching said exposed portion of said contact spacer to form a contact adjacent to said edge and over said location.

17. The method of claim 16, further comprising the steps of:

blanket depositing an interlayer dielectric layer over said first mask, said contact, and said substrate; and planarizing said interlayer dielectric layer to reveal said contact.

18. The method of claim 17, wherein the interlayer dielectric layer has a dielectric constant less than silicon dioxide.

19. The method of claim 17, wherein said step of planarizing said interlayer dielectric layer includes chemical mechanical polishing.

20. The method of claim 16, further comprising the steps of:

removing said first mask;

blanket depositing an interlayer dielectric layer over said contact and said substrate; and planarizing said interlayer dielectric layer to reveal said contact.

21. The method of claim 20, wherein said step of planarizing said interlayer dielectric layer includes chemical mechanical polishing.

22. The method of claim 20, wherein said interlayer dielectric layer has a dielectric constant less than silicon dioxide.

23. The method of claim 16, wherein said step of anisotropic etching comprises reactive ion etching.

24. The method of claim 16, wherein said first mask comprises silicon dioxide.

25. The method of claim 16, wherein said second mask comprises photoresist.

26. The method of claim 16, wherein said conductive contact material and said conductive layer comprise the same material.

27. The method of claim 16, wherein said contact comprises aluminum.

28. The method of claim 16, wherein said contact has an aspect ratio of at least 3.

29. A method of forming a conductive line and a contact, said method comprising the steps of:

providing a substrate;

depositing an underlying dielectric layer over said substrate;

depositing a first conductive layer over said underlying dielectric layer;

forming a first mask over a portion of said first conductive layer, said first mask having an edge;

blanket depositing a second conductive layer over said first conductive layer and said first mask;

forming a second mask over a first portion of said second conductive layer, wherein said first mask and said second mask collectively form a combined mask defining a location for said conductive line and said contact; and etching said second conductive layer and said first conductive layer in alignment with said combined mask to form said conductive line and said contact.

30. The method of claim 29, further comprising the steps of:

removing said second mask to reveal said second conductive layer;

blanket depositing an interlayer dielectric layer over said substrate, said second conductive layer, and said first mask; and planarizing said interlayer dielectric layer to reveal said contact.

31. The method of claim 30, wherein said interlayer dielectric layer has a dielectric constant less than silicon dioxide.

32. The method of claim 30, wherein said step of planarizing said interlayer dielectric layer includes chemical mechanical polishing.

33. The method of claim 29, further comprising the steps of:

removing said first mask and said second mask;

blanket depositing an interlayer dielectric layer over said substrate, said conductive line, and said contact; and planarizing said interlayer dielectric layer to reveal said contact.

34. The method of claim 31, wherein said step of planarizing said interlayer dielectric layer includes chemical mechanical polishing.

35. The method of claim 31, wherein said interlayer dielectric layer has a dielectric constant less than silicon dioxide.

36. The method of claim 29, wherein said first mask comprises silicon dioxide.

37. The method of claim 29, wherein said second mask comprises photoresist.

38. The method of claim 29 wherein said first conductive layer and said second conductive layer comprise the same material.

39. The method of claim 29, wherein said second conductive layer comprises aluminum.

* * * * *